(12) United States Patent
Suehiro et al.

(10) Patent No.: US 7,388,232 B2
(45) Date of Patent: Jun. 17, 2008

(54) LIGHT EMITTING ELEMENT AND LIGHT EMITTING DEVICE

(75) Inventors: Yoshinobu Suehiro, Aichi-ken (JP); Naoki Nakajo, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 35 days.

(21) Appl. No.: 10/974,945

(22) Filed: Oct. 28, 2004

(65) Prior Publication Data

US 2005/0093008 A1    May 5, 2005

(30) Foreign Application Priority Data

Oct. 31, 2003  (JP) .............................. 2003-373273
Apr. 1, 2004   (JP) .............................. 2004-109431

(51) Int. Cl.
*H01L 33/00* (2006.01)
*H01L 27/15* (2006.01)

(52) U.S. Cl. ........................... 257/98; 257/81; 257/95; 257/103; 257/E33.074

(58) Field of Classification Search .................. 257/98, 257/95, 81, 103, E33.074
See application file for complete search history.

(56) References Cited

U.S. PATENT DOCUMENTS 6,495,862 B1 * 12/2002 Okazaki et al. ............. 257/103

| | | | |
|---|---|---|---|
| 6,870,311 B2 * | 3/2005 | Mueller et al. | 313/491 |
| 6,900,473 B2 * | 5/2005 | Yoshitake et al. | 257/95 |
| 2001/0033135 A1 * | 10/2001 | Duggal et al. | 313/506 |
| 2003/0230757 A1 * | 12/2003 | Suehiro et al. | 257/99 |
| 2004/0233524 A1 * | 11/2004 | Lippey et al. | 359/443 |

FOREIGN PATENT DOCUMENTS

| | | |
|---|---|---|
| JP | 06-291366 | 10/1994 |
| JP | 2001-203393 | 7/2001 |
| JP | 2001-217467 | 8/2001 |
| JP | 2002-319708 | 10/2002 |
| JP | 2003-347601 | 12/2003 |

* cited by examiner

*Primary Examiner*—Shouxiang Hu
(74) *Attorney, Agent, or Firm*—McGinn IP Law Group, PLLC

(57) ABSTRACT

A light emitting element has: a light emitting layer of semiconductor; and a diffusion layer that has a refractive index equal to or greater than that of the light emitting layer and that diffuses light emitted from the light emitting layer to increase the external radiation efficiency of the light emitting element. The light emitting layer has a refractive index equal to or greater than that of any layers formed between the light emitting layer and the diffusion layer.

7 Claims, 11 Drawing Sheets

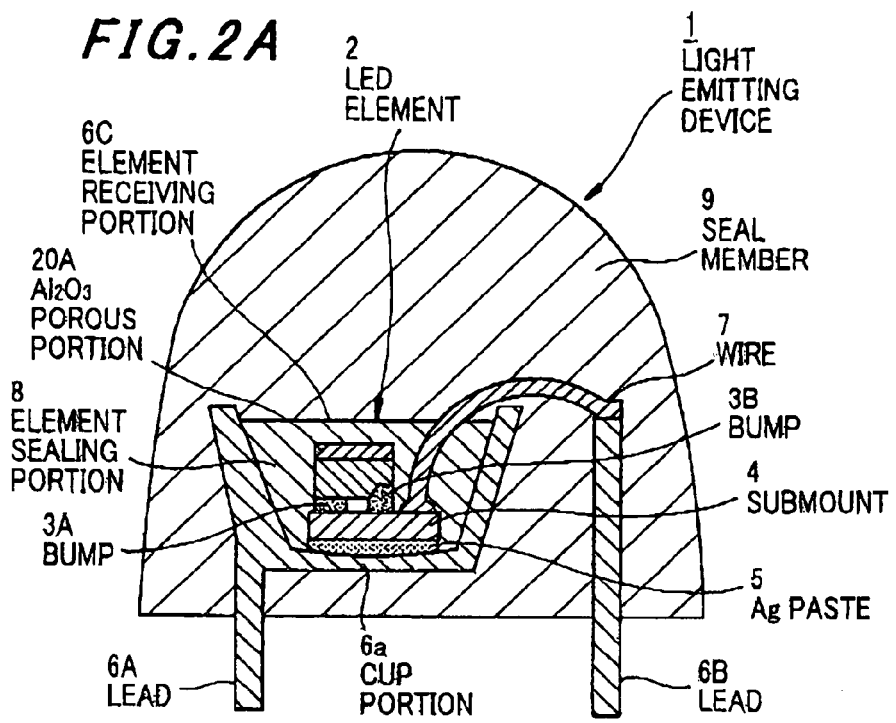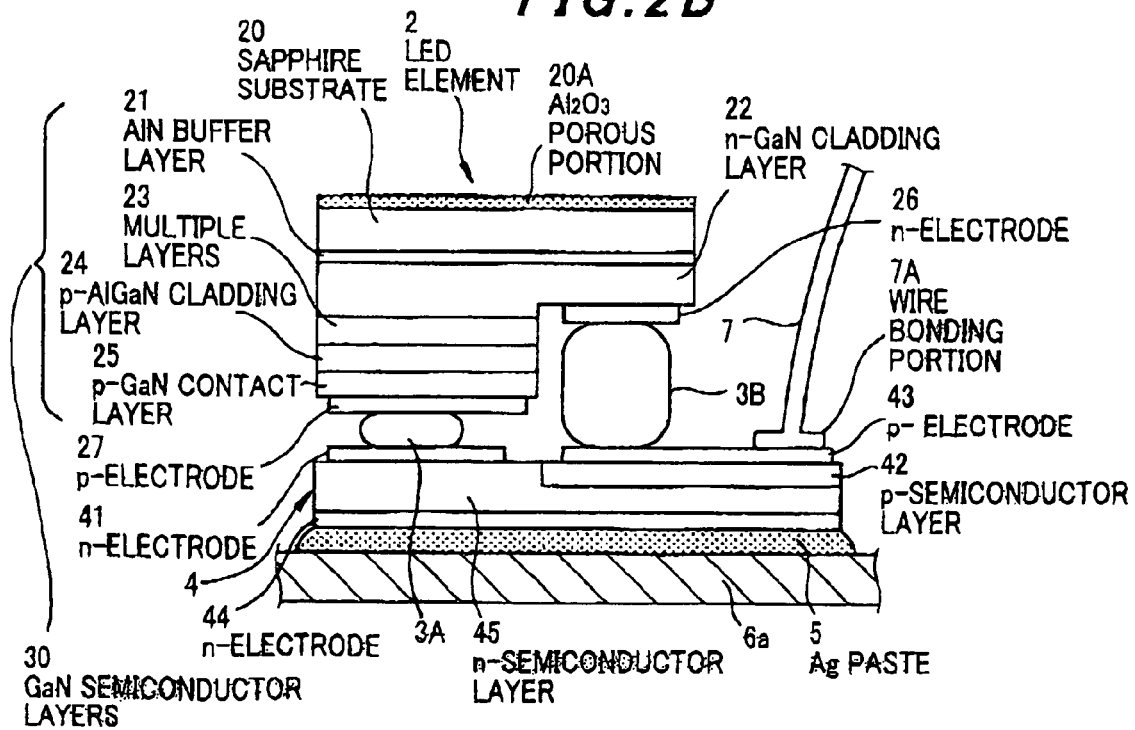

LIGHT EMITTING ELEMENT AND LIGHT EMITTING DEVICE

The present application is based on Japanese patent application Nos. 2003-373273, 2003-401120 and 2004-109431, the entire contents of which are incorporated herein by reference.

BACKGROUND OF THE INVENTION

1. Field of the Invention

This invention relates to a light emitting element and a light emitting device using the same, and particularly relates to a light emitting element and a light emitting device that are provided with an improved external radiation efficiency in light radiated from the semiconductor layer.

2. Description of the Related Art

Conventionally, light emitting devices are known that an LED (light emitting diode) element is mounted on a substrate with a lead frame or a wiring pattern formed thereon. For such light emitting devices, it is important to increase the external radiation efficiency by reducing light confined in the LED element to offer high brightness and output.

The LED element used for the light emitting device includes a face-up type LED element. The face-up type LED element is structured such that p-type and n-type semiconductor layers including a light emitting layer are grown on a substrate such as a sapphire ($Al_2O_3$) substrate by vapor phase growth method, a passivation film for protecting the semiconductor layer or electrode is formed thereon so as to enhance the reliability, and the semiconductor layers side is used as the light radiation surface (light extraction surface).

Japanese patent application laid-open No. 6-291366 (prior art 1) discloses a face-up type LED element that has a passivation film of $SnO_2$ to increase the external radiation efficiency. In prior art 1, the LED element is composed of a sapphire substrate and GaN-based compound semiconductor layers (with refractive index n=2.4) formed on the sapphire substrate, and its electrodes are disposed on the light radiation surface. The light radiation surface except for the electrodes is provided with $SnO_2$ film (n=1.9) as a transparent electrode formed thereon, and the entire LED element is covered with a seal member of epoxy resin (n=1.5) to form a lamp type LED (FIG. 1 in prior art 1).

Further, the LED element used for the light emitting device includes a flip-chip type LED element. The flip-chip type LED element is structured such that semiconductor layers are formed on a transparent substrate such as a sapphire substrate and the transparent substrate side is used as the light radiation surface.

Japanese patent application laid-open No. 2002-219708 (prior art 2) discloses a flip-chip type LED element (LED chip) that an uneven face is provided on the light extraction surface side of substrate to reduce the light loss.

FIG. 1 is a cross sectional view showing an LED element disclosed in prior art 2. In the LED element 200, nitride semiconductor layers composed of a GaN buffer layer 202, an n-type semiconductor layer 203 and a p-type semiconductor layer 204 are formed on a sapphire substrate 201, a p-type electrode 205 is formed on the p-type semiconductor layer 204, and an n-type electrode 206 is formed on the n-type semiconductor layer 203. The LED element 200 is flip-chip bonded through bumps 230a, 230b onto a mount board 210. On the opposite face of sapphire substrate 201 to the surface thereof with the nitride semiconductor layers formed, uneven surfaces 201a, 201b of 1 µm or so are formed by polishing the opposite face while adjusting the grain size of an abrasive (paragraphs [0022]-[0024] and FIG. 2 in prior art 2).

However, the conventional LED elements have the next problems.

(1) If the optical distance (the product of optical path length and medium refractive index) of film thickness is ¼ or [(2m+1)/4; m is an integer] times of emission wavelength, of light coming from the GaN-based compound semiconductor layer to the $SnO_2$ film, perpendicular incident light has an phase difference to light reflected at the interface of epoxy resin and $SnO_2$ film that causes to reduce the interface reflection light and to increase the interface transmission light in light coming from the GaN-based compound semiconductor layer to the $SnO_2$ film. Therefore, the external light extraction efficiency can be enhanced. In like manner, light with such an incident angle that the optical distance in the $SnO_2$ film (the optical distance of light entered into the $SnO_2$ film from the GaN-based compound semiconductor layer, reflected at the interface of epoxy resin and $SnO_2$ film, returned to the $SnO_2$ film and the GaN-based compound semiconductor layer) becomes ¼ or [(2m+1)/4; m is an integer] times of emission wavelength has such an phase difference that causes to reduce the interface reflection light and to increase the interface transmission light. However, if the thin film does not have a large value of m, such light entered to this specific direction from the interface only occupies a small part of all light emitted from the light emitting layer.

On the other hand, in the case of light subjected to total reflection when being entered at an angle greater than its critical angle to the $SnO_2$ interface from the GaN-based compound semiconductor layer, the abovementioned effect of $SnO_2$ film is not obtained because return light as interference light to this light is not generated at the interface of the $SnO_2$ film and the epoxy resin. Provided that light emitted from the light emitting layer is regarded as perfect diffusion light and is externally emitted only from the upper surface, light from the GaN-based semiconductor layer to be subjected to total reflection at the $SnO_2$ film interface occupies about 65% of all light.

(2) In practical use, the LED element disclosed in prior art 2 is generally sealed with epoxy resin with a refractive index of 1.5. In this case, the light extraction efficiency (external radiation efficiency) can be little improved even when the surface of sapphire substrate with a refractive index of 1.7 is roughened. Thus, most of light will be confined in the semiconductor layers and therefore the light emitting device will not offer a high brightness.

SUMMARY OF THE INVENTION

It is an object of the invention to provide a light emitting element and a light emitting device that are provided with an improved external radiation efficiency in light radiated from the semiconductor layer.

According to one aspect of the invention, a light emitting element comprises:

a light emitting layer of semiconductor; and a diffusion layer that diffuses light emitted from the light emitting layer to increase the external radiation efficiency of the light emitting element.

According to another aspect of the invention, a light emitting element comprises:

a light emitting layer of semiconductor; and a diffusion layer that has a refractive index equal to or greater than that of the light emitting layer and that diffuses light emitted from the light emitting layer to increase the external radiation efficiency of the light emitting element, wherein the light emitting layer has a refractive index equal to or greater than that of any layers formed between the light emitting layer and the diffusion layer.

According to another aspect of the invention, a light emitting device comprises:

a light emitting element that comprises semiconductor layers including a light emitting layer, an electrode to supply electric power to the light emitting layer, and a transparent protection layer for protecting the semiconductor layers and the electrode, the protection layer having a refractive index substantially equal to that of the semiconductor layers; and a light extraction portion that is disposed on the protection layer to coat the surface of the light emitting element and to enhance the external radiation efficiency of light emitted from the light emitting layer.

According to another aspect of the invention, a light emitting device comprises:

a light emitting element that comprises semiconductor layers including a light emitting layer, an electrode to supply electric power to the light emitting layer, and a transparent protection layer for protecting the semiconductor layers and the electrode;

a light extraction portion that is disposed on the protection layer to coat the surface of the light emitting element and to enhance the external radiation efficiency of light emitted from the light emitting layer; and a light transmitting material portion that is disposed on the surface of the light extraction portion, wherein the light extraction portion and the protection layer have a refractive index greater than that of the light transmitting material portion.

BRIEF DESCRIPTION OF THE DRAWINGS

The preferred embodiments according to the invention will be explained below referring to the drawings, wherein:

FIG. 2A is a cross sectional view showing a light emitting device in a first preferred embodiment according to the invention;

FIG. 2B is an enlarged cross sectional view showing an LED element 2 in FIG. 2A;

DETAILED DESCRIPTION OF THE PREFERRED EMBODIMENTS

First Embodiment

[Composition of Light Emitting Device 1]

Figure 1:
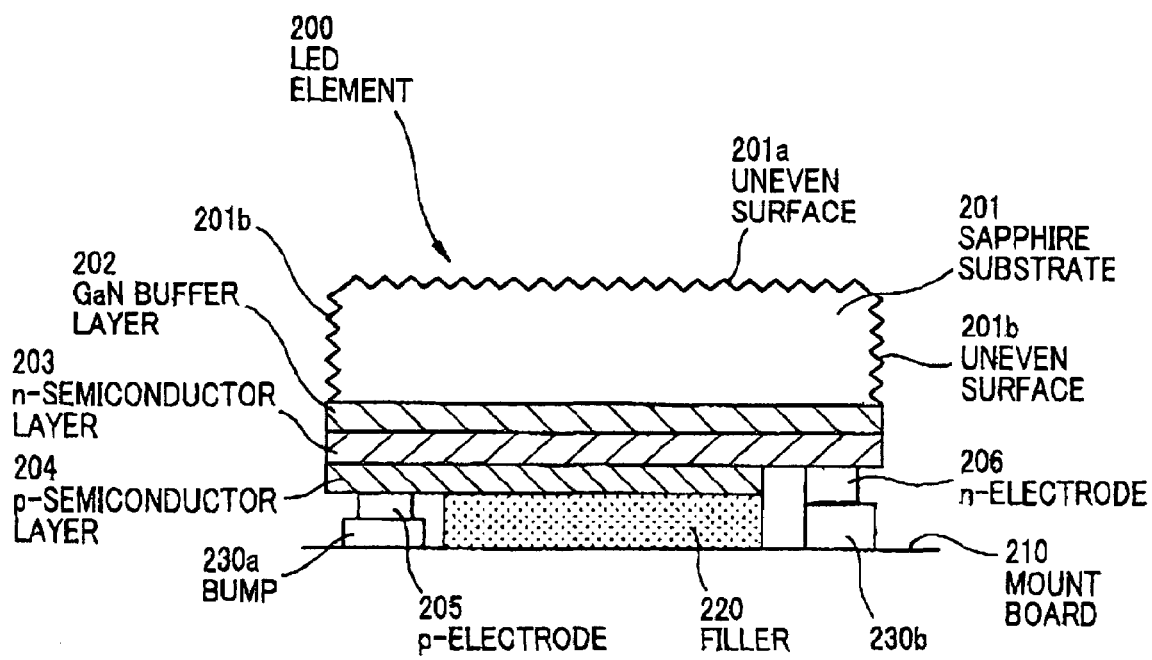
FIG. 1 is a cross sectional view the conventional LED element disclosed in prior art 2.

FIG. 2A is a cross sectional view showing a light emitting device in the first preferred embodiment according to the invention. FIG. 2B is an enlarged cross sectional view showing an LED element 2 in FIG. 2A.

The light emitting device 1 is composed of: a GaN-based LED element 2 that has an $Al_2O_3$ porous portion 20A on the light extraction face side of a sapphire ($Al_2O_3$) substrate 20; a submount 4 that is electrically connected through Au bumps 3A, 3B to electrodes of LED element 2; Ag paste 5 that fixes the submount 4 to a cup portion 6a provided at the end of one lead 6A as well as electrically connecting the submount 4 thereto; an Au wire 7 that electrically connects the submount 4 to a lead 6B; an element sealing portion 8 that seals an element receiving portion 6C with the LED element 2 received therein with seal resin; and a seal member 9 that integrally covers the leads 6A, 6B, the element receiving portion 6C, and the wire 7 with epoxy resin to form the lamp type light emitting device.

[Composition of LED Element 2]

As shown in FIG. 2B, the LED element 2 is composed of: the $Al_2O_3$ porous portion 20A; the sapphire substrate 20; an AlN buffer layer 21; an n-type GaN cladding layer 22; multiple layers 23 including a light emitting layer; a p-type AlGaN cladding layer 24; a p-type GaN contact layer 25; an n-type electrode 26; and a p-type electrode 27. Nitride-based semiconductor layers 30 includes the AlN buffer layer 21, n-type GaN cladding layer 22, multiple layers 23, p-type AlGaN cladding layer 24 and p-type GaN contact layer 25 that are sequentially grown on the sapphire substrate 20. The LED element 2 emits bluish light with an emission wavelength of 460 nm.

The $Al_2O_3$ porous portion 20A is formed by sol-gel method using Al alkoxide on the light extraction face side of sapphire substrate 20.

The submount 4 is made of an n-type silicon substrate. The submount 4 is provided with: an n-electrode 41 connected through the bump 3A to a p-type electrode 27; a p-type semiconductor layer 42; a p-electrode 43 connected through the bump 3B to an n-type electrode 26; an n-electrode 44 electrically connected through the Ag paste 5 to the cup portion 6a; and an n-type semiconductor layer 45. The wire 7 is connected through a wire bonding portion 7A to the p-electrode 43. Electric power is supplied from the wire 7 through the p-electrode 43 and bump 3B to the n-type electrode 26 of LED element 2.

[Process of Making the LED Element 2]

In making the LED element 2, at first, the wafer-shaped sapphire substrate 20 is provided. On the sapphire substrate 20, grown are AlN buffer layer 21, n-type GaN cladding layer 22, multiple layers 23 including light emitting layer, p-type AlGaN cladding layer 24, p-type GaN contact layer 25, n-type electrode 26 and p-type electrode 27 by known growth method such as MOCVD. Then, Al alkoxide is coated on the opposite face of the sapphire substrate 20 to the face thereof with the nitride-based semiconductor layers 30 grown. The coating is conducted by known method such as dipping or spin-coating. Then, the sapphire substrate 20 is heated such that the Al alkoxide is thermally decomposed and the $Al_2O_3$ porous portion 20A is thereby formed on the sapphire substrate 20. The $Al_2O_3$ porous portion 20A has a thin-film structure that microscopic uneven portions or voids are irregularly arranged therein. Finally, the sapphire substrate 20 with the semiconductor layers and $Al_2O_3$ porous portion 20A formed thereon is cut into a predetermined chip size (e.g., 1×1 mm) by dicing to offer LED element 2.

[Operation of Light Emitting Device 1]

When a voltage is applied to the LED element 2 while connecting the leads 6A, 6B to a power source (not shown), the LED element 2 emits planar blue light with a wavelength of 460 nm generated from the multiple layers 23. The blue light emitted from the multiple layers 23 passes through the n-type cladding layer 22 and AlN buffer layer 21, then entering into the $Al_2O_3$ porous portion 20A. At the interface, the blue light with an incident angle smaller than the critical angle passes through the $Al_2O_3$ porous portion 20A and then radiates externally. The blue light with an incident angle greater than the critical angle is diffused by the $Al_2O_3$ porous portion 20A and then radiates externally.

Figure 3:
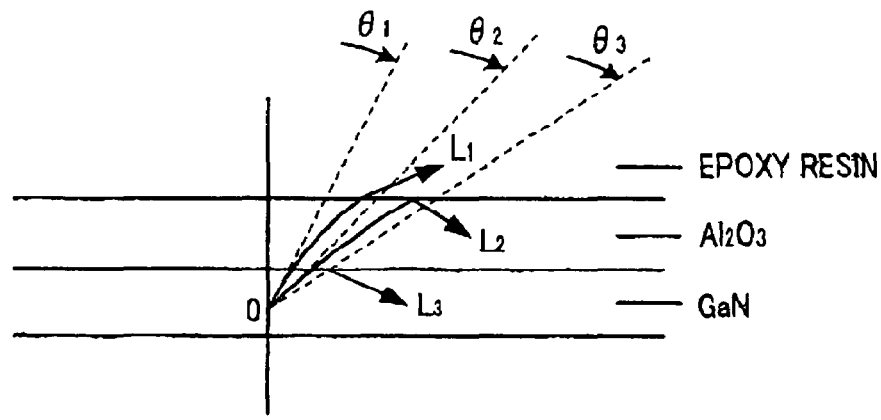
FIG. 3 is an explanatory diagram showing the light transmission state in a light emitting device sealed with epoxy resin.

FIG. 3 is an explanatory diagram showing the light transmission state in a light emitting device sealed with epoxy resin of light generated from a point 0 in GaN layer as shown in FIG. 3, a light component ($L_1$) radiated at an angle of $\theta_1$ passes through from the sapphire substrate ($Al_2O_3$) to epoxy resin, a light component ($L_2$) radiated at an angle of $\theta_2$ is subjected to total reflection at the interface of sapphire substrate and epoxy resin, and a light component ($L_3$) radiated at an angle of $\theta_3$ is subjected to total reflection at the interface of GaN layer and sapphire substrate. The light component subjected to total reflection is attenuated while being repeatedly reflected in the layer, and therefore it is difficult to externally radiate the light component.

Effect of First Embodiment

In the first embodiment, by providing the $Al_2O_3$ porous portion 20A on the light extraction surface of sapphire substrate 20, even part of light with an incident angle greater than the critical angle at the interface can be externally radiated while allowing the transmission (external radiation) of light with an incident angle smaller than the critical angle at the interface. Therefore, the light component to be attenuated due to the optical absorption in the LED element can be reduced and as a result the external radiation efficiency can be enhanced. In other words, even the light components in the range of $\theta_2$ to $\theta_3$ as shown in FIG. 3 can be externally radiated by using the $Al_2O_3$ porous portion 20A.

Further, even when the LED element 2 is sealed with epoxy resin, the light extraction property can be improved since the diffusion of light is also generated at the interface of air in the $Al_2O_3$ porous portion 20A and the surround.

Second Embodiment

[Composition of LED Element 2]

Figure 4:
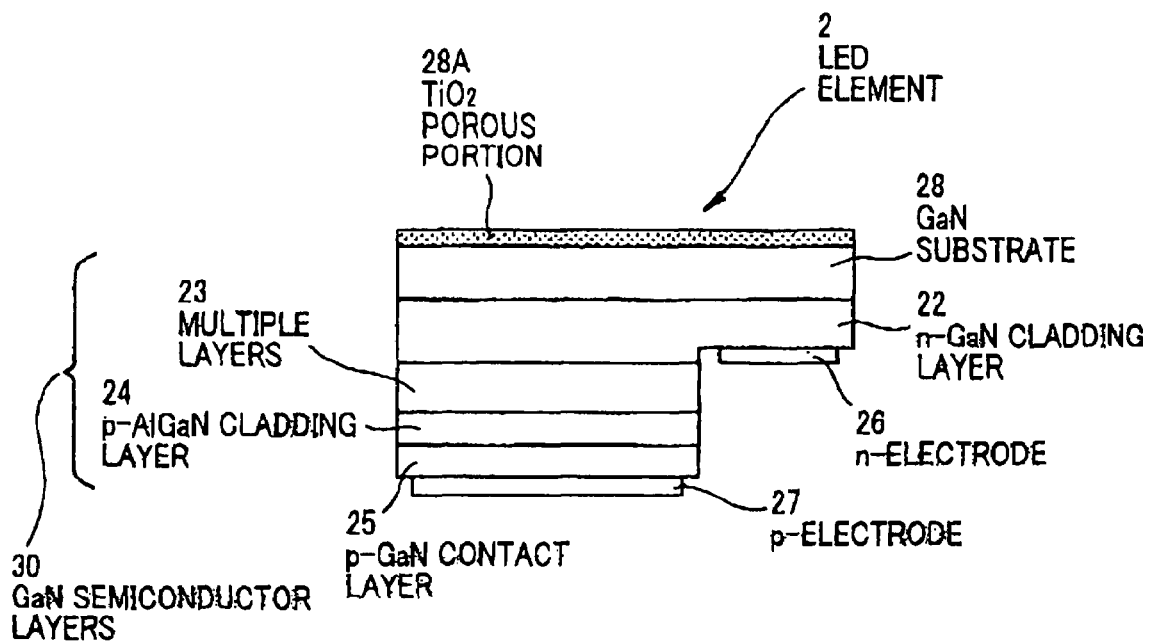
FIG. 4 is a side view showing an LED element in a second preferred embodiment according to the invention.

FIG. 4 is a side view showing an LED element in the second preferred embodiment according to the invention.

The LED element 2 of the second embodiment is different from that of the first embodiment in that a GaN substrate (refractive index n=2.4) 28 is used instead of the sapphire substrate 20 and a $TiO_2$ porous portion (refractive index n=2.6) 28A is formed instead of the $Al_2O_3$ porous portion 20A. Thus, in the second embodiment, the materials with a high refractive index are provided on the light extraction face side so as to enhance the light extraction property from the inside of the substrate to the outside thereof. Meanwhile, in FIG. 4, like components are indicated by the same numerals used in FIG. 2B.

The LED element 2 with the GaN substrate 28 can be made by, e.g., growing a GaN bulk layer, as the GaN substrate 28, and the nitride-based semiconductor layers 30 on the sapphire substrate 20 and then removing the sapphire substrate 20 by cutting or polishing etc.

The $TiO_2$ porous portion 28A is formed by sol-gel method using Ti alkoxide on the light extraction face side of GaN substrate 20, where the $TiO_2$ porous portion 28A is formed thin film after conducting the thermal decomposition of Ti alkoxide.

Effect of Second Embodiment

In the second embodiment, by using the GaN substrate 28, light generated from the multiple layers 23 is not subjected to reflection at the interface of the nitride-based semiconductor layers 30 and the GaN substrate 28.

Further, by providing the $TiO_2$ porous portion 28A with a refractive index greater than that of the GaN substrate 28 on the light extraction face of GaN substrate 28, the reflection at the interface of the GaN substrate 28 and the $TiO_2$ porous portion 28A can be reduced and the entering of light into the $TiO_2$ porous portion 28A can be more increased. As a result, the external radiation efficiency can be enhanced.

Further, since the $TiO_2$ porous portion 28A is included in the apparent size of LED element 2 as a light emitting body, the light emitting element can offer high brightness as compared to the conventional light emitting element with the same size. Namely, the LED element 2 with the $TiO_2$ porous portion 28A can have an increased brightness without increasing the light-source size by means of the enhancement in external radiation efficiency. If the LED element 2 is applied to a package with a light converging system, the package can have easiness in optical control and an external radiation property with high convergence.

Further, in the second embodiment, the $TiO_2$ porous portion 28A may have an uneven surface with a thickness of about 1 μm on the light extraction face thereof. In this case, with the roughened surface of material with a refractive index greater than 2.4, the light extraction efficiency can be significantly enhanced even when the LED element 2 is sealed with epoxy resin.

Third Embodiment

[Composition of LED Element 2]

Figure 5:
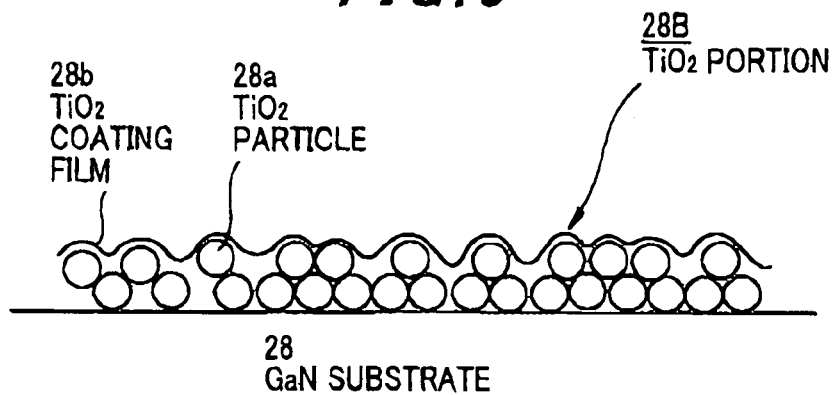
FIG. 5 is an enlarged cross sectional view showing part of an LED element in a third preferred embodiment according to the invention.

FIG. 5 is an enlarged cross sectional view showing part of an LED element in the third preferred embodiment according to the invention.

The LED element 2 of the third embodiment is different from that of the second embodiment in that a TiO$_2$ portion 28B composed of transparent TiO$_2$ particles 28a and TiO$_2$ coating film 28b covering the TiO$_2$ particles 28a is formed on the GaN substrate 28 instead of the TiO$_2$ porous portion 28A. Thus, the TiO$_2$ particle 28a as a transparent particle allows the TiO$_2$ coating film 28b, which is transparent to emission wavelength, to have an uneven surface, whereby light entering into the TiO$_2$ coating film 28b is diffused.

The TiO$_2$ portion 28B is formed by sol-gel method using Ti alkoxide containing the powered TiO$_2$ particles 28a on the light extraction face side of GaN substrate 28, where the TiO$_2$ portion 28B is formed thin film after conducting the thermal decomposition of Ti alkoxide. It is required that the thickness of TiO$_2$ coating film 28b is made less than the diameter of TiO$_2$ particle 28a to provide the TiO$_2$ coating film 28b with the uneven surface.

Effect of Third Embodiment

In the third embodiment, adding to the effects of the second embodiment, the TiO$_2$ portion 28B can have an enlarged surface area due to containing the TiO$_2$ particles 28a.

Further, since light entering into the TiO$_2$ portion 28B is diffused by the TiO$_2$ particles 28a, the external radiation efficiency can be enhanced.

Further, with the roughened surface of material with a refractive index greater than 2.4, the light extraction efficiency can be significantly enhanced even when the LED element 2 is sealed with epoxy resin.

Light-diffusing particles of a material other than TiO$_2$ may be contained in the TiO$_2$ portion 28B. In this case, it is required that the light-diffusing particle is transparent to emission wavelength, and it is desirable that the light-diffusing particle has a refractive index equal to or greater than that of the TiO$_2$ coating film 28b.

Fourth Embodiment

[Composition of LED Element 2]

Figure 6:
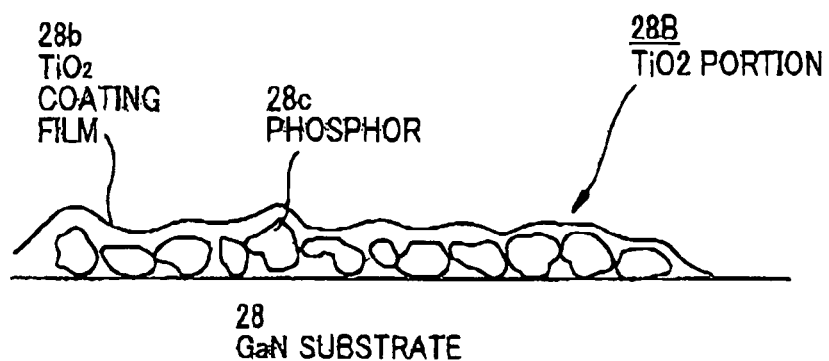
FIG. 6 is an enlarged cross sectional view showing part of an LED element in a fourth preferred embodiment according to the invention.

FIG. 6 is an enlarged cross sectional view showing part of an LED element in the fourth preferred embodiment according to the invention.

The LED element 2 of the fourth embodiment is different from that of the third embodiment in that the TiO$_2$ portion 28B contains phosphors 28c instead of the TiO$_2$ particles 28a.

The phosphor 28c is, for example, Ce:YAG (yttrium aluminum garnet). In this case, it is excited by blue light with a wavelength of 460 nm and radiates yellow excited light with a wavelength of 520 to 550 nm. The yellow excited light is mixed with blue light, thereby generating white light.

Figure 7:
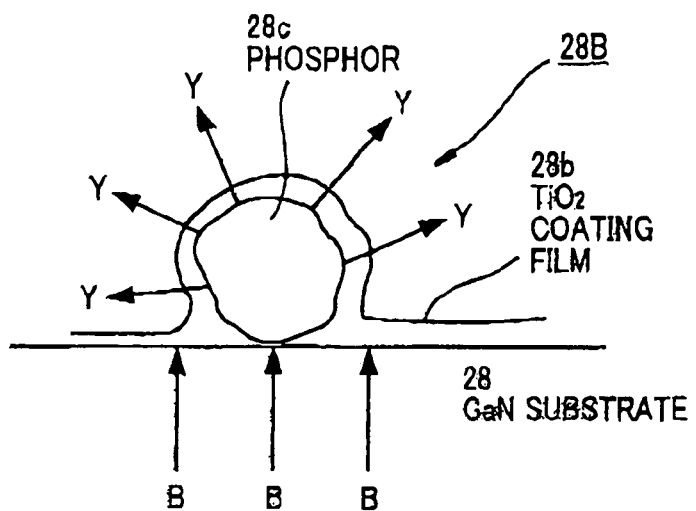
FIG. 7 is an enlarged cross sectional view showing a $TiO_2$ portion 28B in FIG. 6.

FIG. 7 is an enlarged cross sectional view showing the TiO$_2$ portion 28B in FIG. 6. The phosphor 28c is surrounded by the TiO$_2$ coating film 28b, and blue light (indicated by arrows B in FIG. 7) entering from the GaN substrate 28 is guided by the TiO$_2$ coating film 28b and irradiated to the entire surface of phosphor particle 28c. The yellow excited light (indicated by arrows Y in FIG. 7) is also radiated from the entire surface thereof.

Effect of Fourth Embodiment

In the fourth embodiment, adding to the effects of the second and third embodiments, the excited light can be radiated from the entire surface of phosphor particle 28c.

Further, with the TiO$_2$ coating film 28b surrounding the phosphor 28c, the surface area of TiO$_2$ portion 28B can be enlarged.

Further, since the yellow excited light and blue light are densely radiated from the enlarged light radiation surface, the wavelength conversion efficiency can be enhanced and thereby the white light emitting element can offer higher brightness.

Although an LED element with epoxy resin layer containing phosphor coated thereon is conventionally known, the LED element only has such a function that only light (about 30% of whole light) radiated at an angle within $\theta_2$ as shown in FIG. 3 can enter into the epoxy resin layer where it is subjected to the excitation of phosphor.

Further, although in generating white light therefrom, it is needed to suitably balance the amount of blue light and yellow light, both blue light and yellow light may be not passed through the phosphor layer and attenuated therein if the balancing is conducted only over the LED element. Therefore, the concentration of phosphor must be increased to such an extent that it affects the external radiation efficiency.

Further, light radiated at an angle greater than $\theta_3$ will be confined in the LED element and most of the light will be attenuated. Especially, in the multiple layers, the absorption ratio (attenuation ratio) of confined light will be increased because they have a band corresponding to the emission wavelength.

In contrast, in the fourth embodiment, since the substantially equal refractive indexes are laid between the GaN-based semiconductor layers and the phosphor layer, light reflection at the interface therebetween does not occur. Therefore, all light generated from the GaN-based semiconductor layers can be targeted to the excitation of phosphor 28c. The light thus entered is suitably absorbed by the phosphor 28c, and the phosphor 28c is excited and radiates excited light from the entire surface.

Further, since the phosphor 28c is surrounded by the TiO$_2$ coating film 28b of high refractive index material, light can be more readily radiated outside of the TiO$_2$ coating film 28b.

Further, blue light not subjected to the excitation of phosphor 28c may be diffused and reflected without entering into the phosphor 28c, and it can be efficiently radiated outside of the TiO$_2$ coating film 28b with the uneven surface.

Further, the phosphor 28c can be efficiently excited because it is surrounded by the high refractive index material which can include multi-reflection light. Since light to enter into the TiO$_2$ coating film 28b surrounding the phosphor 28c is confined among phosphors 28c and multi-reflected thereby, the excitation can be efficiently conducted at the entire surface of phosphor 28c. Therefore, even when the concentration of phosphor 28c is reduced, the suitable balancing of white light can be readily obtained. In addition, it can be avoided that both blue light and yellow light is not passed through the phosphor layer and attenuated therein.

Further, light excited by the phosphor 28c is converted into a long wavelength and therefore not subjected to absorption at a band corresponding to emission wavelength. Thus, its attenuation ratio in the light emitting element becomes lower than that of blue light and its external radiation efficiency becomes higher. Therefore, the white LED element 2 can be downsized while offering high brightness. Further, since the $TiO_2$ portion 28B to produce white light can be formed in wafer stage, the productivity can be enhanced and the accuracy of color tone adjustment can be enhanced.

Further, since the phosphor layer is not formed on the side, it is desirable that the LED element 2 is thinned as long as it does not cause some trouble in the fabrication process. In the fourth embodiment, for regular type, the width and thickness each are about 300 μm and about 100 μm, and for large current type, about 1000 μm and about 100 μm.

Alternatively, the phosphor layer may be formed partly on the side by forming a groove by conducting wide half-cutting in wafer state and then coating the phosphor layer.

Although in the fourth embodiment the LED chips are made by dicing after the phosphor layer is formed on the wafer GaN substrate 28, the $TiO_2$ coating film 28b to surround the phosphor 28c may be formed after the dicing if the heat resistance of electrode can be secured. Alternatively, the phosphor layer may be formed all on the side of LED element 2.

In the fourth embodiment, the $TiO_2$ portion 28B may contain the $TiO_2$ particle as a light diffusion particle explained in the third embodiment to be mixed with the phosphor 28c. In this case, the other light diffusion particle of a material other than $TiO_2$ may be mixed therein. The phosphor 28c may be a phosphor complex instead of a phosphor particle.

The inventors found that, in the case of a GaN-based LED element with GaN-based semiconductor layers and $Al_2O_3$ coating film formed on a sapphire substrate, the external radiation efficiency can be enhanced as compared to the conventional LED element, though not coming up to that of the LED element 2 in the fourth embodiment.

In producing white light, other than the mixing of blue light and yellow light, the wavelength conversion mixing of ultraviolet light and excited light from RGB phosphors may be used. The emission light color is not limited to white and may be another color produced by wavelength conversion.

Although in the fourth embodiment the wet type alkoxide preparation is used, a dry type preparation with a high refractive index may be of phosphor of oxynite glass and $TiO_2$ and made by sputtering them simultaneously to mix the phosphor in the preparation.

Although in the first to fourth embodiments the invention is applied to the GaN-based LED element 2, the invention can be applied to LED elements of the other material such as GaP-based or GaAs-based semiconductors.

Fifth Embodiment

[Composition of Light Emitting Device 1]

Figure 8A:
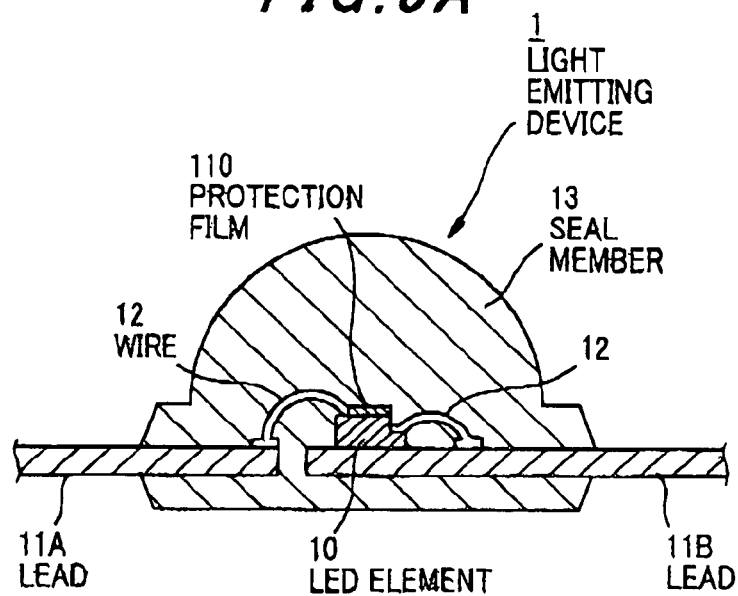
FIG. 8A is a cross sectional view showing a light emitting device in a fifth preferred embodiment according to the invention.
Figure 8B:
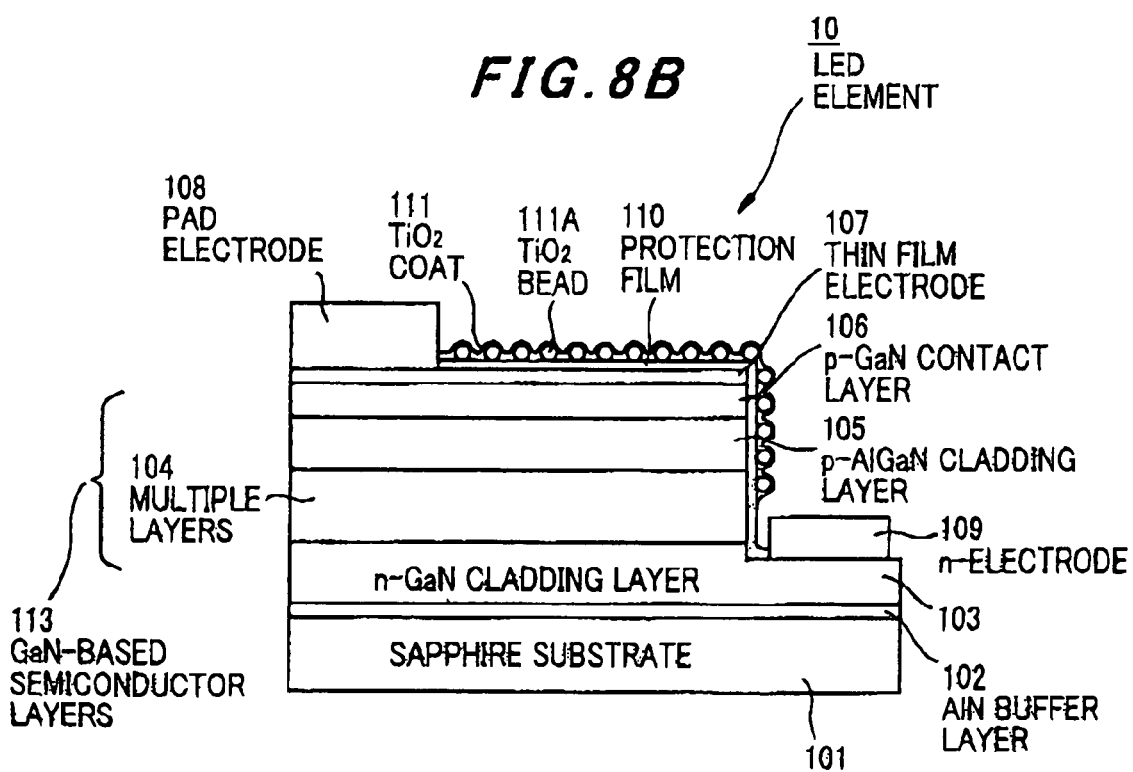
FIG. 8B is an enlarged side view showing an LED element 10 in FIG. 8A.

FIG. 8A is a cross sectional view showing a light emitting device in the fifth preferred embodiment according to the invention. FIG. 8B is an enlarged side view showing an LED element 10 in FIG. 8A.

The light emitting device 1 is composed of: a face-up type LED element 10 of GaN-based semiconductor compound; lead members 11A, 11B that are of copper and electrically connected to the LED element 10; wires 12 that are of gold and connects between the LED element 10 and the leads members 11A, 11B; a seal member 13 that is of epoxy resin (n=1.5) and seals integrally the LED element 10, lead members 11A, 11B and wires 12.

[Composition of LED Element 10]

As shown in FIG. 8B, the LED element 10 is composed of: a sapphire substrate 101; an AlN buffer layer 102; an n-type GaN cladding layer 103; multiple layers 104 including a light emitting layer; a p-type AlGaN cladding layer 105; a p-type GaN contact layer 106; a thin-film electrode 107 of fold; a pad electrode 108 connected to the thin-film electrode 107; an n-type electrode 109 formed on the n-type GaN cladding layer 103; a protection film 110 provided on the upper and side faces of LED element 10 except for the pad electrode 108 and n-type electrode 10; and a $TiO_2$ coat 111 that contains $TiO_2$ beads and is provided on the upper and side faces.

Nitride-based semiconductor layers 113 are composed of the AlN buffer layer 102, n-type GaN cladding layer 103, multiple layers 104, p-type AlGaN cladding layer 105, and p-type GaN contact layer 106 that are grown on the sapphire substrate 101. The LED element 110 is a large chip with a size of 1×1 mm. It may be another chip with a size of e.g., 0.3×0.3 mm.

The protection film 110 is a thin film of $TiO_2$ made by sputtering and has a refractive index (n=2.6) equal to that of nitride-based semiconductor layers 113. It also serves as electrical insulation due to the covering between the pad electrode 108 and n-type electrode 109.

The $TiO_2$ coat 111 is provided as a preparation for offering the light diffusion property, and it is a thin film of $TiO_2$ made by thermally treating Ti alkoxide at 400° C. The $TiO_2$ coat 111 contains, as a light diffusion particle, $TiO_2$ beads 111A with a diameter less than 1 μm and is thereby formed uneven.

[Process of Making the LED Element 2]

On the sapphire substrate 101, grown are the AlN buffer layer 102, n-type GaN cladding layer 103, multiple layers 104 including the light emitting layer, p-type AlGaN cladding layer 105, p-type GaN contact layer 106 by known growth method such as MOCVD. Then, in order to secure a region need to form the n-type electrode 109, the p-type GaN contact layer 106 to the n-type GaN cladding layer 103 are partly etched. Then, the thin-film electrode 107 is formed on the surface of p-type GaN contact layer 106. Then, the pad electrode 108 is formed on the surface of thin-film electrode 107 and the n-type electrode 109 is formed on the surface of n-type GaN cladding layer 103. Then, the $TiO_2$ protection film 110 is formed by sputtering on the entire upper surface except for the pad electrode 108 and n-type electrode 109. Then, the wafer is cut into a desired chip size by dicing to obtain the LED element 10.

[Process of Making the Light Emitting Device 1]

A lead frame (not shown) is provided that has the lead members 11A, 11B with a predetermined shape. The LED element 10 is bonded through Ag paste onto the lead member 11B. Then, the lead member 11A is electrically connected through the wire 12 to the pad electrode 108 of LED element 10, and the lead member 11B is electrically connected through the wire 12 to the n-type electrode 109 of LED element 10. Then, the $TiO_2$ coat 111 is formed by coating Ti alkoxide containing the $TiO_2$ beads 111A on the upper and side faces of LED element 10 and then thermally treating it at 400° C. The $TiO_2$ coat 111 is formed porous by the thermal treatment. Then, resin sealing is conducted by using a mold (not shown) to the lead member 1A and the lead member with the LED element 10 mounted thereon.

Thereby, the seal member 13 of epoxy resin is integrally formed. The seal member 13 is formed such that a dome corresponding to the shape of mold is provided on the light radiation surface side of LED element 10. The resin sealing can be conducted by transfer molding. Then, the lead members 11A, 11B are cut off from the lead frame.

[Operation of Light Emitting Device 1]

When power is supplied to the lead members 11A, 11B from a power source (not shown), light is emitted from the multiple layers 104 of the LED element 10. Of light emitted from the multiple layers 104, a light component heading to the sapphire substrate 101 is reflected on the interface of the sapphire substrate 101 and the AlN buffer layer 102 or the bottom face of the sapphire substrate 101. On the other hand, a light component heading to the light radiation surface passes through the thin-film electrode 107, entering into the protection film 110, entering into the $TiO_2$ coat 111. The light entering into the $TiO_2$ coat 111 enters into the seal member 13 while being diffused by the $TiO_2$ beads 111A, being radiated outside of the seal member 13. Further, a light component being repeatedly reflected in the multiple layers 104 enters into the protection film 110 on the side face, entering into the seal member 13, being radiated outside of the seal member 13.

Effect of Fifth Embodiment

The fifth embodiment offers the following effects.
(1) Since the protection film 110 with a refractive index equal to or greater than that of nitride-based semiconductor layers 113 composing the LED element 10 is formed on the upper and side faces of the LED element 10, light emitted from the multiple layers 104 can enter into the protection film 110 without being reflected at the interface. Thereby, light to be confined in the nitride-based semiconductor layers 113 can be reduced. In the conventional LED element, the protection film of $SiO_2$ for the insulation between the electrodes has a refractive index n=1.5 smaller than that of semiconductor layers, and therefore the external radiation efficiency out of the LED element lowers. In this embodiment, even when the internal emission efficiency is equal to that of the conventional LED element, light can enter into the protection film 110 without having any internal loss such as interface reflection and, therefore, the light radiation efficiency can be enhanced.
(2) Further, since the surface of the protection film 110 is covered with the $TiO_2$ coat 111 having the refractive index equal to or greater than that of the protection film 110 and containing the $TiO_2$ beads 111A, the LED element 10 can have the uneven surface on the upper and side faces to increase the surface area. Thereby, light can be diffused while reducing the internal loss such as interface reflection and therefore the external radiation efficiency can be enhanced.
(3) Since the transparent and porous thin film can be obtained by forming the $TiO_2$ coat 111 by the thermal treatment of Ti alkoxide, the optical shape on the upper and side faces can be complicated. Thereby, the light diffusion property can be further enhanced in addition to that by the $TiO_2$ beads 111A.
(4) Since the external radiation efficiency can be thus enhanced even in the face-up type LED element 10 with the electrodes formed on the upper face, high brightness can be obtained as compared to the same type of light emitting device without the protection film 110 and $TiO_2$ coat 111.

Sixth Embodiment

[Composition of LED Element 10]

Figure 9:
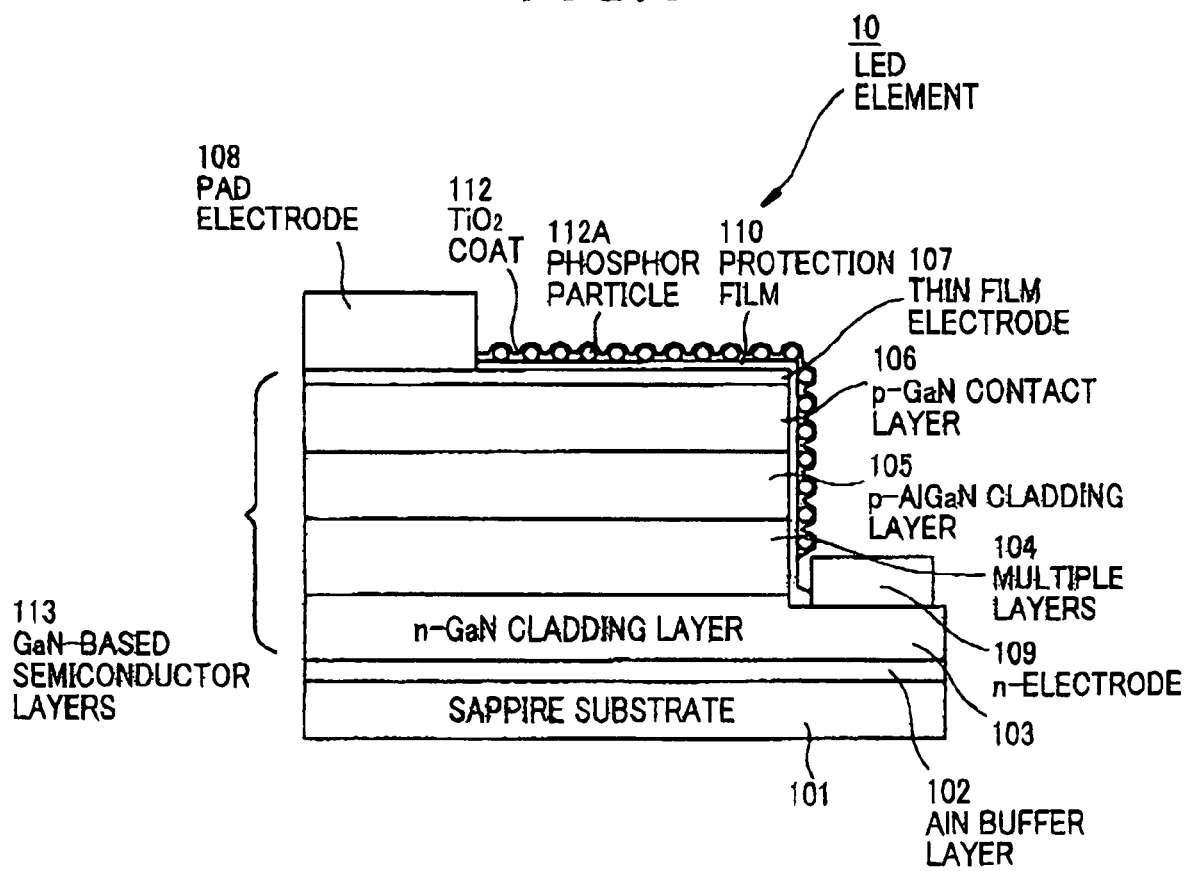
FIG. 9 is a side view showing an LED element in a sixth preferred embodiment according to the invention.

FIG. 9 is a side view showing an LED element in the sixth preferred embodiment according to the invention.

The LED element 10 of the sixth embodiment has a wavelength conversion type structure that a $TiO_2$ coat 112 containing phosphor particles 112A is formed on the protection film 110. In this embodiment, like components are indicated by the same numerals used in the fifth embodiment.

The phosphor particle 112A is, for example, Ce:YAG (yttrium aluminum garnet). In this case, it is excited by blue light with a wavelength of 460 nm and radiates yellow excited light with a wavelength of 520 to 550 nm. The yellow excited light is mixed with blue light, thereby generating white light.

Effect of Sixth Embodiment

In the sixth embodiment, adding to the effects of the fifth embodiment, the excited light can be radiated from the entire surface of phosphor particle 112A since the phosphor particles 112A are provided on the light extraction surface side.

Further, with the $TiO_2$ coat 112 surrounding the phosphor particle 112A, the surface area of $TiO_2$ coat 112 can be enlarged.

Further, since the yellow excited light and blue light are densely radiated from the enlarged light radiation surface, the wavelength conversion efficiency can be enhanced and thereby the white light emitting element can offer higher brightness.

Although an LED element with epoxy resin layer containing phosphor coated thereon is conventionally known, the LED element only has such a function that only light (about 30% of whole light) radiated at a critical angle of n=1.4 to 1.5 can enter into the epoxy resin layer where it is subjected to the excitation of phosphor.

Further, although in generating white light therefrom, it is needed to suitably balance the amount of blue light and yellow light, both blue light and yellow light may be not passed through the phosphor layer and attenuated therein if the balancing is conducted only over the LED element. Therefore, the concentration of phosphor must be increased to such an extent that it affects the external radiation efficiency. Especially, in the multiple layers, the absorption ratio (attenuation ratio) of confined light will be increased because they have a band corresponding to the emission wavelength.

In contrast, in the sixth embodiment, since the substantially equal refractive indexes are laid between the nitride-based semiconductor layers 113 and the phosphor layer, light reflection at the interface therebetween does not occur. Therefore, all light generated from the nitride-based semiconductor layers can be targeted to the excitation of phosphor particle 112A. The light thus entered is suitably absorbed by the phosphor particle 112A, and the phosphor particle 112A is excited and radiates excited light from the entire surface.

Further, since the phosphor particle 112A is surrounded by the $TiO_2$ coat 112 of high refractive index material, light can be more readily radiated outside of the $TiO_2$ coat 112.

Further, blue light not subjected to the excitation of phosphor particle 112A may be diffused and reflected without entering into the phosphor particle 112A, and it can be efficiently radiated outside of the $TiO_2$ coat 112 with the uneven surface.

Further, the phosphor particle 112A can be efficiently excited because it is surrounded by the high refractive index material which can include multi-reflection light. Since light to enter into the $TiO_2$ coat 112 surrounding the phosphor particle 112A is confined among the phosphor particles 112A and multi-reflected, thereby, the excitation can be efficiently conducted at the entire surface of phosphor particle 112A. Therefore, even when the concentration of phosphor particles 112A is reduced, the suitable balancing of white light can be readily obtained. In addition, it can be avoided that both blue light and yellow light is not passed through the phosphor layer and attenuated therein.

Further, light excited by the phosphor particle 112A is converted into a long wavelength and therefore not subjected to absorption at a band corresponding to emission wavelength. Thus, its attenuation ratio in the light emitting element becomes lower than that of blue light, and its external radiation efficiency becomes higher. Therefore, the white LED element 10 can be downsized while offering high brightness. The phosphor particle 112A may be a phosphor complex instead of phosphor particle.

Seventh Embodiment

[Composition of Light Emitting Device 1]

Figure 10A:
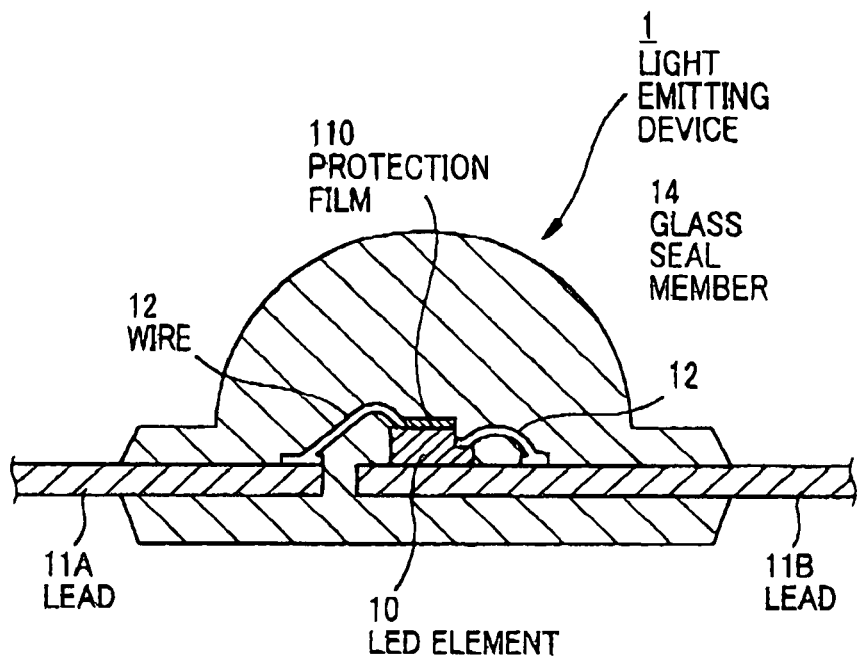
FIG. 10A is a cross sectional view showing a light emitting device in a seventh preferred embodiment according to the invention.
Figure 10B:
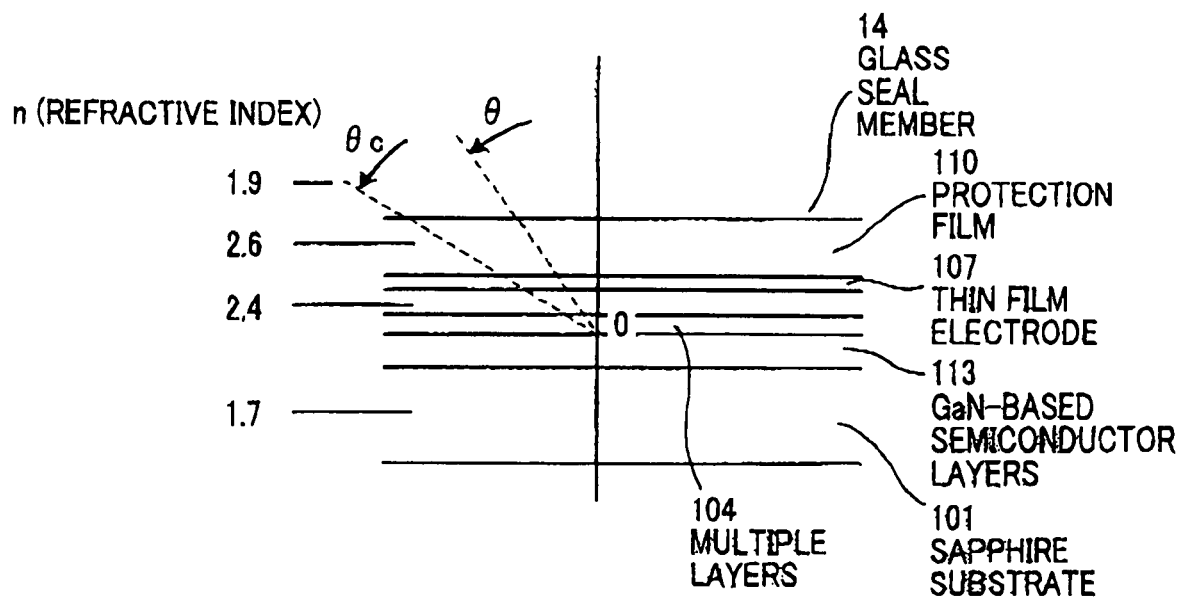
FIG. 10B is an explanatory diagram showing the light radiation state in an LED element 10 in FIG. 10A.

FIG. 10A is a cross sectional view showing a light emitting device in the seventh preferred embodiment according to the invention. FIG. 10B is an explanatory diagram showing the light radiation state in an LED element 10 in FIG. 10A. In this embodiment, like components are indicated by the same numerals used in the fifth embodiment.

The light emitting device 1 of the seventh embodiment is structured such that a glass seal member 14 of glass with high refractive index (processing temperature: 450° C., n=1.9) is used instead of the seal member 13 of the fifth embodiment, and the $TiO_2$ coat 111 of the fifth embodiment is omitted from the light emitting device 10.

Light emitted from the multiple layers 104 of LED element 10 passing through the thin-film electrode 107 and enters into the protection film 110. Then, the emitted light within a critical angle $\theta c$ as shown in FIG. 10B enters into the glass seal member 14.

Effect of Seventh Embodiment

In the seventh embodiment, since the LED element 10 with the protection film 110 ($TiO_2$, n=2.6) formed on the light extraction surface is sealed with the glass seal member 14, the light emitting device 1 can have good light stability and heat resistance.

Further, light emitted from the nitride-based semiconductor layers 113 can reach the interface of the protection film 110 and the glass seal member 14 without being reflected at the interface to the thin-film electrode 107. The emitted light within the critical angle $\theta c=52$ degrees is externally radiated through the glass seal member 14. Thus, the light extraction efficiency can be enhanced.

For example, if the protection film 110 is of $SiO_2$ which is conventionally used, only light within $\theta=39$ degrees as shown in FIG. 10B can enter into the glass seal member 14. Even if the LED element is sealed with a high refractive index material, the light emitting device can have only external radiation efficiency equal to that of epoxy-sealed (refractive index=1.5). In this condition, even when the $TiO_2$ coat 111 of the fifth embodiment is formed, light cannot sufficiently enter into the protection film 110 ($SiO_2$) and therefore it cannot have the light extraction efficiency equal to that of the fifth embodiment.

Although in the seventh embodiment the glass with a refractive index n=1.9 is used, the significant property can be obtained by using a seal material with refractive index of 1.7 or greater.

Although in the fifth to seventh embodiments the nitride-based semiconductor layers 113 is formed on the sapphire substrate and the protection film and preparation of $TiO_2$ is provided on the light extraction surface, a GaN substrate or SiC substrate may be used. Also, the protection film and preparation provided on the light extraction surface may be of a material with a refractive index equal to or greater than that of nitride-based semiconductor layers 113. However, in view of the external radiation from the protection film or light extracting means, the refractive index is preferably equal to that. For example, in the case of GaN-based LED element, the protection film and preparation provided on the light extraction surface may be of ZnS (n=2.4), diamond (n=2.4) etc. Also, $SnO_2$ (n=1.9) with a refractive index slightly lower than that of the nitride-based semiconductor layers 113 can have the significant external radiation property. Further, even a material with a still lower refractive index, if it has a refractive index greater than that of epoxy resin as the seal member, may have such an effect.

Meanwhile, since GaAs light emitting element has a refractive index greater than 3, the range of protection film material with an equal refractive index will be limited.

Further, the composition of LED element 10 may be altered. For example, one of the electrodes may be provided on the opposite side to the light extraction surface, or the p-type and n-type electrodes each may be provided near the opposite sides.

Eighth Embodiment

[Composition of Light Emitting Device 1]

Figure 11A:
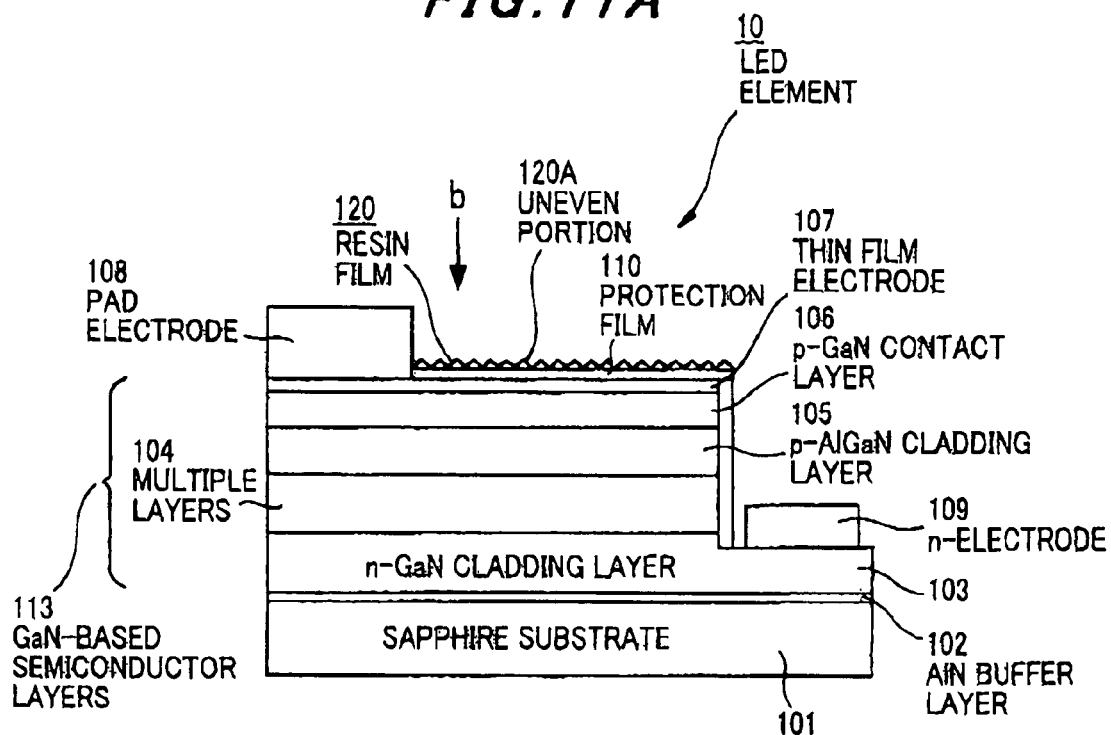
FIG. 11A is a side view showing an LED element in an eighth preferred embodiment according to the invention.
Figure 11B:
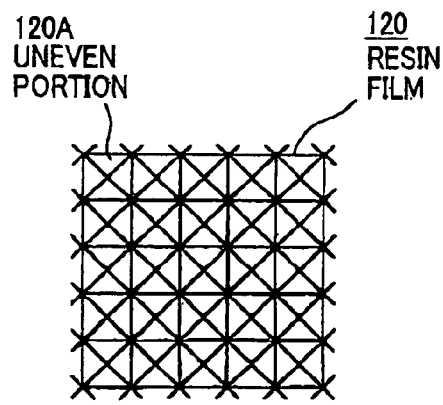
FIG. 11B is a top view showing part of surface of the LED element 10 viewed to a direction of arrow b in FIG. 11A.

FIG. 11A is a side view showing an LED element in the eighth preferred embodiment according to the invention. FIG. 11B is a top view showing part of surface of the LED element 10 viewed to a direction of arrow b in FIG. 11A.

The LED element 10 of the eighth embodiment is provided, on the thin-film electrode 107 of the fifth embodiment, with the protection film 110 of a SiN-based material (n=1.8) and a resin film 120 of thermosetting resin (n=2.1). In this embodiment, like components are indicated by the same numerals used in the fifth embodiment.

As shown in FIG. 11A, the resin film 120 has uneven portion 120A on the surface. Thereby, light coming through the protection film 110 from the nitride-based semiconductor layers 113 is diffused and externally radiated.

[Process of Making the Resin Film 120]

At first, a region for the pad electrode 108 and n-type electrode 109 is masked. Then, a 100 μm thick film material of thermosetting resin is attached on the surface of protection film 110 except for the masked region. Then, the surface with the film material attached thereon is pressed by using a mold with an uneven pattern to mold a 100 μm deep groove on the surface of film material. Then, the entire LED element 10 is thermally treated at 175° C. to harden the film material to form the resin film 120. Then, the masked region for electrodes is removed by etching.

Effect of Eighth Embodiment

The eighth embodiment offers the following effects.
(1) Since the resin film 120 of film material with a refractive index that is greater than that of the protection film 110 and approximate to that of the nitride-based semiconductor layers 113 is formed on the protection film 110, light emitted from the multiple layers 104 reaches the interface to the glass seal member 14 without being reflected at the interface to the thin-film electrode 107, entering into the glass seal member 14 and being externally radiated. Therefore, the light extraction efficiency can be enhanced.
(2) By attaching the film material with a refractive index equal to that of the protection film 110 on the protection film 110, the resin film 120 with a uniform thickness can be formed on the LED element 10. Thereby, light can be uniformly taken out from the light extraction surface.
(3) With the 100 μm thick resin film 120 with the uneven portion 120A, the area of light extraction surface can be enlarged and the light extraction efficiency can be enhanced. Also, the light diffusion means can be readily provided on the surface of LED element 10.
(4) Due to the resin molding, the fine pattern can be readily formed.

Although in the eighth embodiment the resin film 120 is formed by attaching the film material on the protection film 110, the film material may have the uneven portion formed before the attaching.

Further, other than the film material, varnish thermosetting resin may be used such that it is molded to form the resin film 120 with the uneven portion 120A.

Further, the resin film 120 may be roughened by surface roughening other than forming the uneven portion 120A.

Ninth Embodiment

[Composition of LED Element 10]

Figure 12:
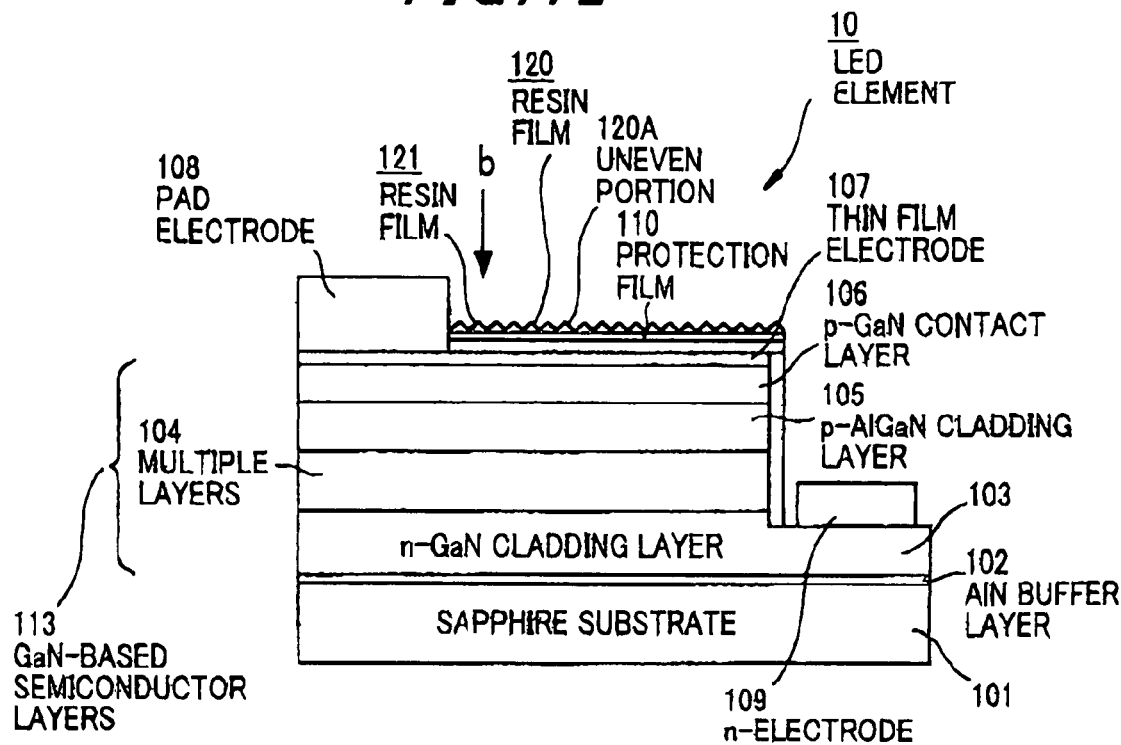
FIG. 12 is a side view showing an LED element in a ninth preferred embodiment according to the invention.

FIG. 12 is a side view showing an LED element in the ninth preferred embodiment according to the invention.

The LED element 10 of the ninth embodiment has, different from the eighth embodiment, a wavelength conversion structure that a resin film 121 containing phosphor is formed between the protection film 110 of SiN (n=1.8) and the resin film 120 described in the eighth embodiment. In this embodiment, like components are indicated by the same numerals used in the fifth embodiment.

The resin film 121 is a phosphor-contained film material that Ce:YAG (yttrium aluminum garnet) phosphor is contained in the thermosetting resin described in the eighth embodiment. It is excited by blue light emitted from the multiple layers 104 and radiates yellow light.

[Process of Making the Resin Film 121]

At first, a region for the pad electrode 108 and n-type electrode 109 is masked. Then, the 100 μm thick phosphor-contained film material of thermosetting resin is attached on the surface of protection film 110 except for the masked region. Then, the 100 μm thick film material of thermosetting resin is attached on the phosphor-contained film material. Then, the surface with the film material attached thereon is pressed by using a mold with an uneven pattern to mold a 100 μm deep groove on the surface of film material. Then, the entire LED element 10 is thermally treated at 175° C. to harden the phosphor-contained film material and film material to form the resin film 121 and 120. Then, the masked region for electrodes is removed by etching.

Effect of Ninth Embodiment

The ninth embodiment offers the following effects.
(1) In Addition to the effects of the eighth embodiment, since the resin film 121 is of the thermosetting resin with a refractive index close to that of nitride-based semiconductor layers 113 and contains the phosphor, the light reflection at the interface of the nitride-based semiconductor layers 113 to the resin film 121 can be reduced and the phosphor can be uniformly irradiated with light. The excitation of phosphor can be enhanced and unevenness in white color generated from blue light and excited light can be reduced.
(2) Since the thickness of resin film 121 is decreased as thin as 100 μm, it can be avoided that the light extraction efficiency lowers due to the light absorption of phosphor. Further, since the phosphor is formed in uniform thickness, the wavelength-converted white light can be uniformly taken out from the entire light extraction surface.
(3) Since it is processed at a low temperature as compared to the case of alkoxide, the high refractive index material layer containing the phosphor can be readily formed without imposing thermal damage to the other components.

Also in this embodiment, as the film material to compose the resin film 120, the varnish thermosetting resin may be used such that it is molded to form the resin film 120 with the uneven portion 120A.

Tenth Embodiment

[Composition of LED Element 2]

Figure 13:
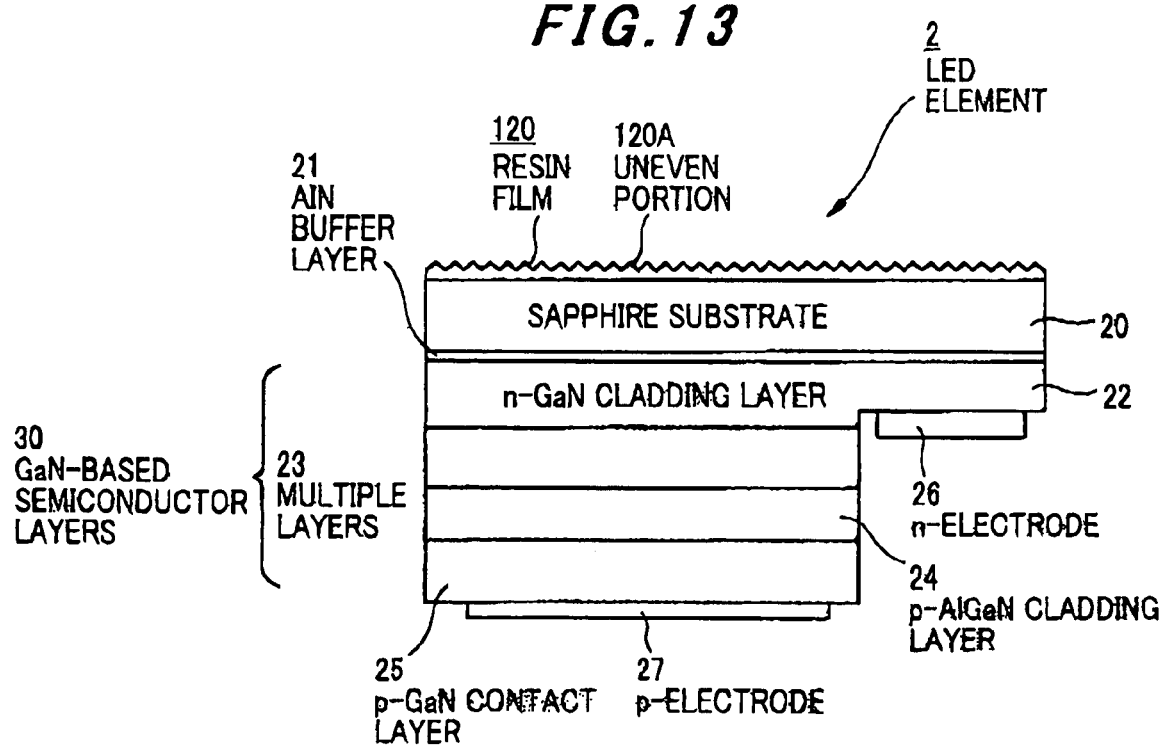
FIG. 13 is a side view showing an LED element in a tenth preferred embodiment according to the invention.

FIG. 13 is a side view showing an LED element in the tenth preferred embodiment according to the invention.

The LED element 2 of the tenth embodiment is composed such that, in the LED element 2 of the first embodiment, the Al2O3 porous portion 20A provided on the sapphire substrate 20 is replaced by the resin film 120 of thermosetting resin (n=2.1) described in the eighth embodiment. In this embodiment, like components are indicated by the same numerals used in the first embodiment.

The resin film 120 has the uneven portion 120A on the surface, and light coming through the sapphire substrate 20 is diffused by the uneven portion 120A and radiated externally.

[Process of Making the LED Element 2]

In making the LED element 2, at first, the wafer-shaped sapphire substrate 20 is provided. On the sapphire substrate 20, grown are AlN buffer layer 21, n-type GaN cladding layer 22, multiple layers 23 including light emitting layer, p-type AlGaN cladding layer 24, p-type GaN contact layer 25, n-type electrode 26 and p-type electrode 27 by known growth method such as MOCVD. Then, a 100 μm thick film material of thermosetting resin is attached onto the opposite face of the sapphire substrate 20 to the face thereof with the nitride-based semiconductor layers 30 grown. Then, the surface with the film material attached thereon is pressed by using a mold with an uneven pattern to mold a 100 μm deep groove on the surface of film material. Then, the entire LED element 2 is thermally treated at 175° C. to harden the film material to form the resin film 120. Finally, the sapphire substrate 20 with the semiconductor layers and the resin film 120 formed thereon is cut into a predetermined chip size (e.g., 1×1 mm) by dicing to offer LED element 2.

Effect of Tenth Embodiment

The tenth embodiment offers the following effects.
(1) Since the resin film 120 that has a refractive index greater than that of the sapphire substrate 20 and is of thermosetting resin is provided on the sapphire substrate 20, light emitted from the multiple layers 23 of nitride-based semiconductor layers 30 can be diffused by the uneven portion 120A and can enter into the seal member 9.
(2) Since the resin film 120 with good light diffusion property is as a thin film provided on the surface of sapphire substrate 20, the light absorption of resin film 120 in transmission can be reduced and thereby the light extraction efficiency can be enhanced.
(3) Since the light extraction surface can be formed without avoiding the electrodes, the LED element 2 can be manufactured readily and efficiently.

Eleventh Embodiment

Figure 14:
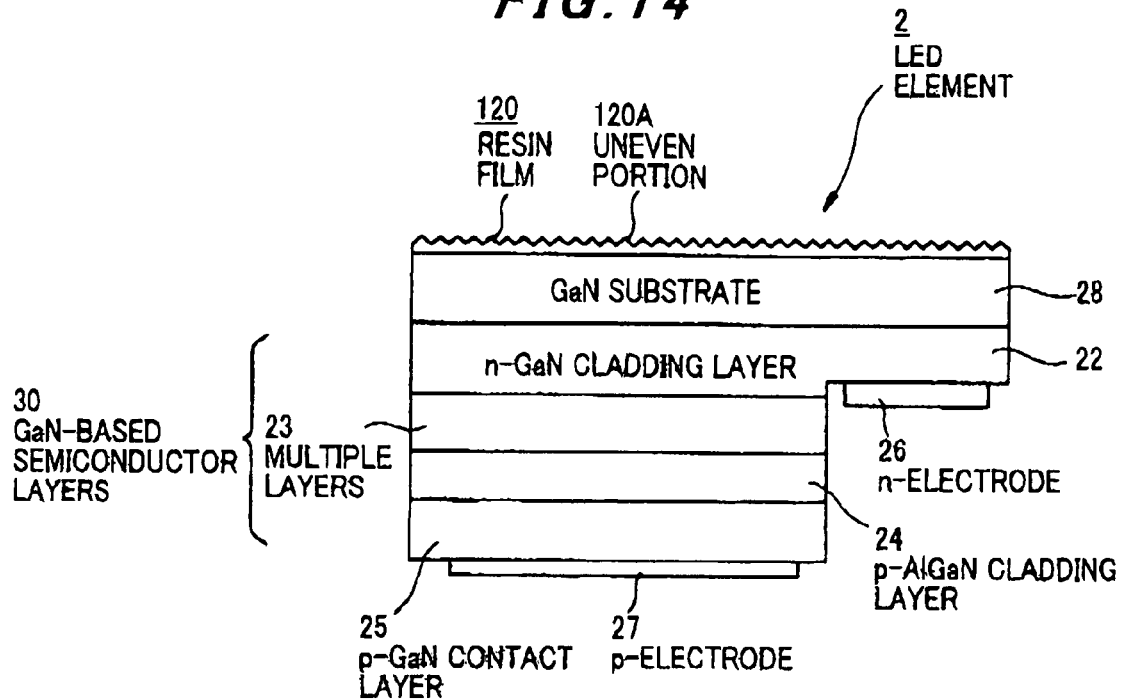
FIG. 14 is a side view showing an LED element in an eleventh preferred embodiment according to the invention.

[Composition of LED Element 2]
FIG. 14 is a side view showing an LED element in the eleventh preferred embodiment according to the invention.

The LED element 2 of the eleventh embodiment is different from that of the tenth embodiment in that a GaN substrate (refractive index n=2.4) 28 is used instead of the sapphire substrate 20.

Effect of Eleventh Embodiment

In the eleventh embodiment, light emitted from the nitride-based semiconductor layers 30 can pass through the GaN substrate 28 without generating the interface reflection caused by the refractive index difference between the nitride-based semiconductor layers 30 and the sapphire substrate 20.

The uneven portion 120A of resin film 120 serves to diffuse light reaching the surface of GaN substrate 28 to radiate it to the seal member 9. Thereby, the light extraction efficiency of LED element 2 can be enhanced.

Twelfth Embodiment

Figure 15:
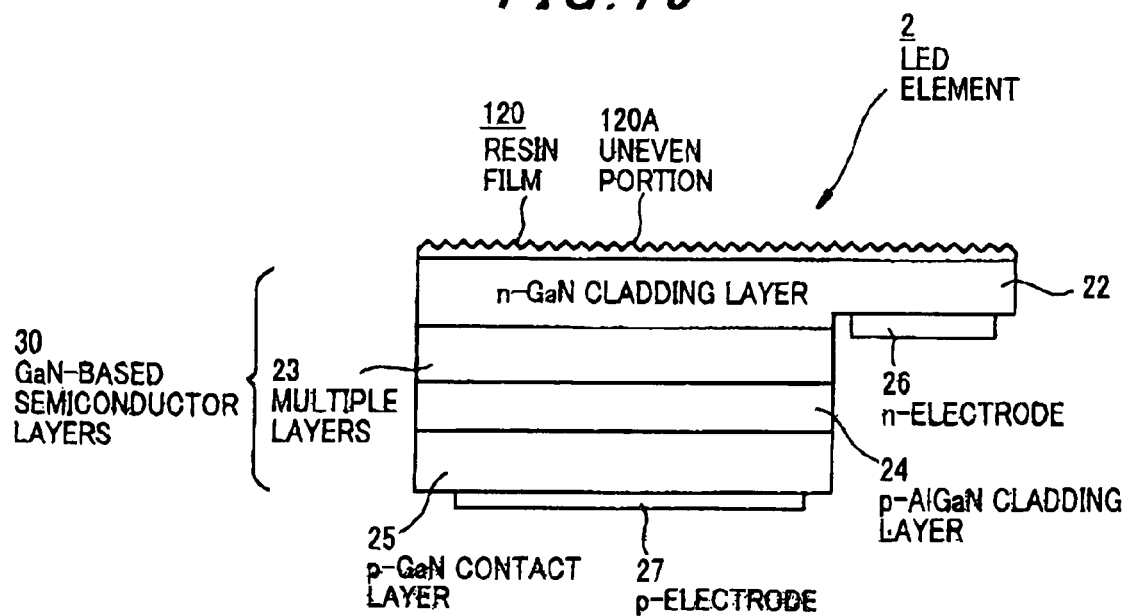
FIG. 15 is a side view showing an LED element in a twelfth preferred embodiment according to the invention.

[Composition of LED Element 2]
FIG. 15 is a side view showing an LED element in the twelfth preferred embodiment according to the invention.

The LED element 2 of the twelfth embodiment is different from that of the tenth embodiment in that the sapphire substrate 20 of the LED element 2 in the tenth embodiment is removed and the resin film 120 with uneven portion 120A is formed on the GaN-based semiconductor layers 30.

Effect of Twelfth Embodiment

In the twelfth embodiment, by removing the sapphire substrate 20, the thickness of LED element 2 can be reduced and the light absorption or optical loss from the multiple layers 23 to the resin film 120 can be prevented.

Figure 16:
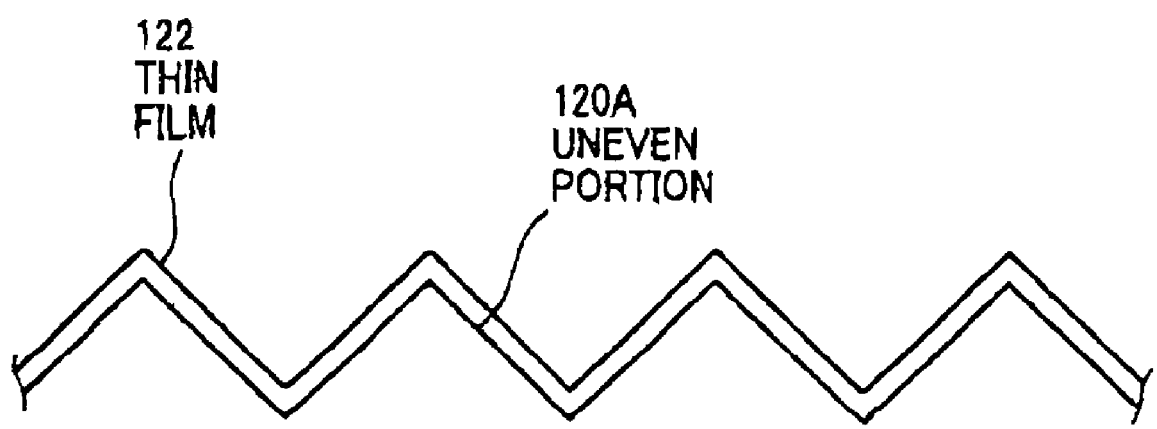
FIG. 16 is an enlarged side view showing part of uneven portion 120A in FIG. 15 with a thin film of SiN (n=1.8) as an interference film formed thereon.

FIG. 16 is an enlarged side view showing part of uneven portion 120A in FIG. 15 with a thin film 122 of SiN (n=1.8) as an interference film formed thereon.

As shown in FIG. 16, the resin film 120 may be provided with the thin film 122 of SiN (n=1.8) as an interference film formed on the uneven portion 120A. By the thin film 122 formed on the surface of resin film 120, light can be externally radiated being diffused at the interface to the resin film 120 with a refractive index n=2.1. Therefore, even when the LED element 2 is sealed with the seal member 9 with a low refractive index, the light extraction efficiency can be enhanced.

Meanwhile, in the tenth to twelfth embodiments, the phosphor-contained high refractive index layer (121) may be provided. In this case, the diffusion and reflection effects can be obtained by phosphor itself as well as the diffusion effects by phosphor-excited radiation light. Therefore, even without forming the uneven portion, the light extraction efficiency can be enhanced.

In the above embodiments, the multiple layers 23 or 104 including the light emitting layer may have a homo-or hetero-epitaxial structure, and a quantum well structure such as multiquantum well (MQW) or single quantum well (SQW).

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting element, comprising:
  plural GaN-based semiconductor layers comprising a light emitting layer; and
  a diffusion layer that diffuses light emitted from the semiconductor layers to increase the external radiation efficiency of the light emitting element,
  wherein the plural GaN-based semiconductor layers further comprise a light extraction face,
  wherein the diffusion layer comprises a $TiO_2$ coating film that substantially wraps phosphor particles and has an uneven surface, and has a refractive index substantially equal to or greater than that of the light extraction face,
  wherein the $TiO_2$ coating film contacts directly the light extraction face, and
  wherein said $TiO_2$ coating film has a thickness substantially smaller than sizes of the phosphor particles, such that the uneven surface of the $TiO_2$ coating film at least partially conforms with top surfaces of the phosphor particles.

2. The light emitting element according to claim 1, wherein:
  the diffusion layer further substantially wraps light diffusing particles.

3. The light emitting element according to claim 2, wherein:
  the phosphor particles comprise a light diffusion property.

4. The light emitting element according to claim 2, wherein:
  the light diffusing particles comprise a bead-shaped light transmitting particle.

5. The light emitting element according to claim 1, wherein:
  the phosphor particles comprise a light diffusion property.

6. The light emitting element according to claim 1, wherein:
  the diffusion layer further substantially wraps a bead-shaped light transmitting particle.

7. The light emitting element according to claim 1, wherein at least a part of the diffusion layer is formed by a sol-gel method using an alkoxide.

\* \* \* \* \*

UNITED STATES PATENT AND TRADEMARK OFFICE
CERTIFICATE OF CORRECTION

PATENT NO. : 7,388,232 B2  
APPLICATION NO. : 10/974945  
DATED : June 17, 2008  
INVENTOR(S) : Yoshinobu Suehiro et al.

Page 1 of 1

It is certified that error appears in the above-identified patent and that said Letters Patent is hereby corrected as shown below:

On the Title page, in item (30) Foreign Application Priority Data, insert:

--December 1, 2003     (JP)     2003-401120--

Signed and Sealed this

Thirtieth Day of December, 2008

JON W. DUDAS  
*Director of the United States Patent and Trademark Office*